(12) United States Patent
Princinsky et al.

(10) Patent No.: US 10,985,648 B2
(45) Date of Patent: Apr. 20, 2021

(54) SYSTEMS AND METHODS FOR POWER MONITORING AND CONTROL

(71) Applicant: Applied Energy LLC, Saginaw, MI (US)

(72) Inventors: Daniel Princinsky, Saginaw, MI (US); William Hinton, Reese, MI (US)

(73) Assignee: Applied Energy LLC, Saginaw, MI (US)

( * ) Notice: Subject to any disclaimer, the term of this patent is extended or adjusted under 35 U.S.C. 154(b) by 0 days.

(21) Appl. No.: 16/273,983

(22) Filed: Feb. 12, 2019

(65) Prior Publication Data

US 2020/0259412 A1    Aug. 13, 2020

(51) Int. Cl.
*H02M 1/42*        (2007.01)
*G01R 31/50*       (2020.01)
*H01F 27/42*       (2006.01)

(52) U.S. Cl.
CPC .......... *H02M 1/4216* (2013.01); *G01R 31/50* (2020.01); *H01F 27/425* (2013.01)

(58) Field of Classification Search
CPC ..... H02M 1/4216; G01R 3/025; H01F 27/425
See application file for complete search history.

(56) References Cited

U.S. PATENT DOCUMENTS

| | | | |
|---|---|---|---|
| 3,764,855 A | 10/1973 | Beachley | |
| 4,200,836 A | 4/1980 | Okada et al. | |
| 6,888,709 B2 | 5/2005 | Princinsky et al. | |
| 2003/0206391 A1* | 11/2003 | Princinsky | H02H 9/04 361/600 |
| 2004/0264094 A1* | 12/2004 | Rahman | H02H 7/0455 361/115 |
| 2007/0067121 A1* | 3/2007 | Przydatek | G01R 22/06 702/57 |
| 2009/0099832 A1* | 4/2009 | Nasle | G06F 17/5009 703/18 |
| 2009/0309425 A1* | 12/2009 | Princinsky | H02J 3/01 307/105 |

(Continued)

FOREIGN PATENT DOCUMENTS

EP    2 293 401 A1    3/2011

OTHER PUBLICATIONS

Characteristics of Different Power Systems Neutral Grounding Techniques: Fact & Fiction, D.D. Shipp, Westinghouse Electric Corp., Pittsburgh, PA and F.J. Angelini, Westinghouse Electric Corp., Philadelphia, PA.

(Continued)

*Primary Examiner* — Rafael O De Leon Domenech
(74) *Attorney, Agent, or Firm* — Baker Botts L.L.P.

(57) ABSTRACT

An apparatus for power monitoring and voltage suppression comprising a reference node, a first transformer, a second transformer, a third transformer, a resistive element, a ground fault indicator, a current detector, a power quality meter, and a meter power supply is provided. The transformers have first sides and secondary sides, with the secondary sides connected in series. The resistive element and the ground fault indicator are connected in parallel to the secondary sides of the transformers. The circuit connecting the secondary sides, the resistive element, and the ground fault indicator is not electrically connected to ground.

22 Claims, 5 Drawing Sheets

(56) References Cited

U.S. PATENT DOCUMENTS

2011/0153234 A1* 6/2011 Winterhalter .......... H02H 3/332
  702/58
2012/0043967 A1* 2/2012 Miura ................... B60L 3/0069
  324/426
2016/0349954 A1* 12/2016 Thompson ................ G05F 1/66

OTHER PUBLICATIONS

Resistive Grounding Techniques, Martin Glover, Post Glover Resistors, Incorporated, Erlanger, KY.
Extended European Search Report dated Jul. 23, 2020 in Application No. EP 20156708.

* cited by examiner

SYSTEMS AND METHODS FOR POWER MONITORING AND CONTROL

BACKGROUND

Field of the Disclosed Subject Matter

The disclosed subject matter relates to power monitoring and control.

Description of Related Art

The electrical grid or power grid is an interconnected network for delivering electricity from producers to consumers. However, the generating capability, distribution, and end user systems of the power grid can be susceptible to imbalances or damage caused by voltage abnormalities, which can result from, for example, terrestrial weather events, geomagnetic disturbances, potential enemy attack, and everyday usage by its customers.

In many settings, including but not limited to manufacturing plants, factories, or other large-scale systems that utilize three-phase power, short duration surges of electrical energy, known as voltage transients, can cause problems in electrical systems. Voltage transients can be caused, for example, by switching occurring at an upstream power-station, arcing ground faults, lightning strikes, or by other means. Voltage transients can impair or damage equipment connected to the affected three-phase circuit.

Electrical systems can employ circuit interrupters to decrease potential for equipment damage, yet voltage transients can have negative effects in such systems. For example, voltage transients can cause the circuit interrupters to open the circuit, which can result in generalized power outages affecting large portions of the electrical system. Power outages can have several negative effects, including for example economic effects resulting from the downtime of otherwise productive equipment, at least until the circuit can be re-energized. Additionally, power outages can be undesirable for safety reasons, for example on maritime vessels on which control systems are configured to remain powered to navigate the vessel.

Certain conventional systems for transient voltage surge suppression can present challenges. For example, metal oxide varistors (MOVs) and silicon avalanche diodes (SADs) can be configured to suppress or clamp voltage surges only after the voltage reaches about double or more of the voltage normally present in the circuit. Such higher than normal voltages allowed by such systems can impair or damage devices receiving power from the circuit, and can cause permanent failure of the components. Additionally, the effectiveness or performance of conventional transient voltage suppressors can be degraded over time due to suppressing transient voltages, and thus can require frequent or periodic replacement to remain effective at suppressing transient voltages.

Power systems can also bleed current to ground as a result of voltage transient suppression. For example and without limitation, a 480 Volt distribution systems powered by a 2000 to 3000 KVA ungrounded delta power transformer feeding approximately 1000 ft of bus duct can have a predicted current of about 1 to 3 Amperes. In conventional systems, this current of about 1-3 Amperes can be bled to ground as a result of voltage transient suppression.

It therefore is desirable to provide power monitor and voltage moderating systems that have reduced tendency for power outages, maintain system voltage within a narrower range, degrade less by voltage suppression, and do not require bleeding current to ground.

SUMMARY

The purpose and advantages of the disclosed subject matter will be set forth in and are apparent from the description that follows, as well as will be learned by practice of the disclosed subject matter. Additional advantages of the disclosed subject matter will be realized and attained by the subject matter particularly pointed out in the written description and claims hereof, as well as from the appended drawings.

To achieve these and other advantages and in accordance with the purpose of the disclosed subject matter, as embodied herein and broadly described, the disclosed subject matter includes a system for power monitoring and voltage suppression comprising a reference node, a first transformer, a second transformer, a third transformer, a resistor, a pilot light, a current detector, a power quality meter, and a meter power supply.

As embodied herein, the first transformer has a primary side and a secondary side, wherein the first transformer primary side has a first primary terminal coupled to the first single-phase power supply and a second primary terminal coupled to the reference node, and wherein the first transformer secondary side has a first secondary terminal and a second secondary terminal. The second transformer has a primary side and a secondary side, wherein the second transformer primary side has a third primary terminal coupled to the second single-phase power supply and a fourth primary terminal coupled to the reference node, and wherein the second transformer secondary side has a third secondary terminal coupled to the second secondary terminal and a fourth secondary terminal. The third transformer has a primary side and a secondary side, wherein the third transformer primary side has a fifth primary terminal coupled to the third single-phase power supply and a sixth primary terminal coupled to the reference node, and wherein the third transformer secondary side has a fifth secondary terminal coupled to the fourth secondary terminal and a sixth secondary terminal.

As further embodied herein, the resistor and the pilot light are coupled between the sixth secondary terminal and the first secondary terminal, in parallel. The current detector is configured to measure the current flowing through said first secondary terminal. The power quality meter is configured to measure the power quality of the first, second, and third single-phase power supplies, and is coupled to a meter power supply, wherein the meter power supply is coupled to the three-phase power supply. Furthermore, the circuit formed by the resistor, the pilot light, the first transformer secondary side, the second transformer secondary side, and the third transformer secondary side is not electrically connected to the reference node.

It is to be understood that both the foregoing general description and the following detailed description and drawings are examples and are provided for purpose of illustration and are not intended to limit the scope of the disclosed subject matter in any manner.

The accompanying drawings, which are incorporated in and constitute part of this specification, are included to illustrate and provide a further understanding of the devices of the disclosed subject matter. Together with the description, the drawings serve to explain the principles of the disclosed subject matter.

BRIEF DESCRIPTION OF THE DRAWINGS

The subject matter of the application will be more readily understood from the following detailed description when read in conjunction with the accompanying drawings, in which.

DETAILED DESCRIPTION

Reference will now be made in detail to the disclosed subject matter, examples of which are illustrated in the accompanying drawings. Particularly, the disclosed subject matter will be described in conjunction with a detailed description of a power monitor and voltage control system and method.

As disclosed herein, power monitor and voltage control systems and methods disclosed herein can be used to suppress transient voltage surges in power systems. The power monitor and voltage control systems disclosed herein have three single-phase transformers and a resistor are connected to form a voltage suppression circuit.

In accordance with the disclosed subject matter, a method of power monitoring and voltage controlling is also provided. The method of the disclosed subject matter includes coupling a three-phase power supply to a power monitor and voltage moderation apparatus, the apparatus comprising a reference node, a first transformer, a second transformer, a third transformer, a resistor, a pilot light, a current detector, a power quality meter, and a meter power supply in accordance with the disclosed subject matter.

For purpose of understanding, and in accordance with another aspect of the disclosed subject matter, reference is made to an exemplary embodiment. For purpose of illustration and not limitation, FIG. 1 illustrates an exemplary power monitor and voltage suppression system in accordance with the disclosed subject matter, generally including a voltage moderation circuit 100, a power quality meter 143, and a meter power supply 145.

Figure 1:
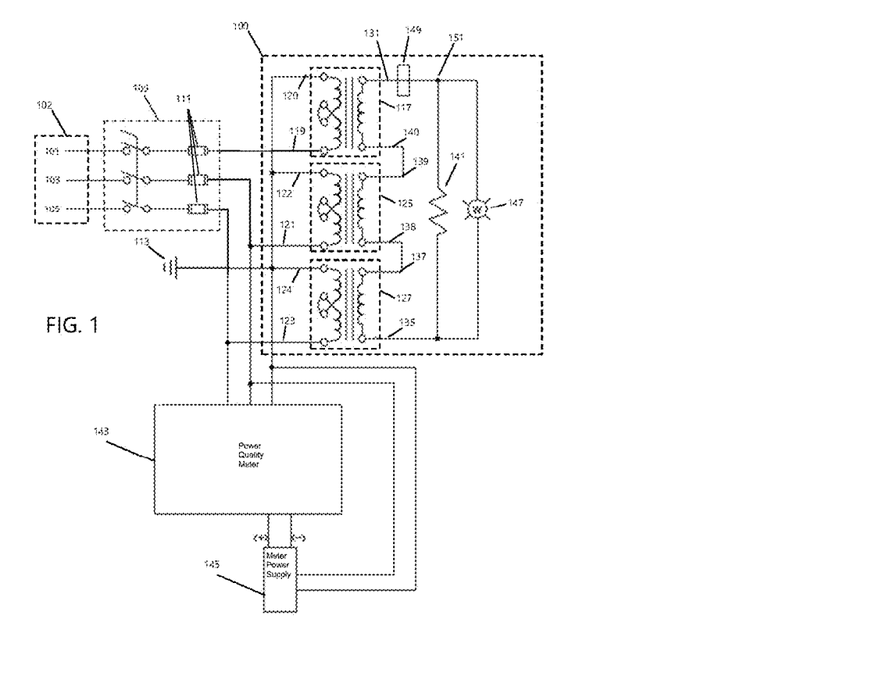
FIG. 1 is a schematic diagram illustrating an exemplary embodiment of a power monitor and voltage control system, in accordance with the disclosed subject matter.

With reference to FIG. 1, voltage moderation circuit 100 can include a first transformer 117, a second transformer 125, a third transformer 127, and a resistor 141. As shown in FIG. 1, for purpose of illustration and not limitation, each of the first transformer 117, the second transformer 125, and the third transformer 127 can be a single-phase transformer. First transformer 117 can have first primary terminal 119 on a primary side that can be connected to first single-phase power supply 101 through fused disconnect 109, second transformer 125 can have third primary terminal 121 on a primary side that can be connected to second single-phase power supply 103 through fused disconnect 109, and third transformer 127 can have fifth primary terminal 123 on a primary side that can be connected to third single-phase power supply 105 through fused disconnect 109. Additionally, first transformer 117 can have second primary terminal 120 on a primary side, second transformer 125 can have fourth primary terminal 122 on a primary side, and third transformer 127 can have sixth primary terminal 124 on a primary side. The second primary terminal 120, the fourth primary terminal 122, and the sixth primary terminal 124 can be connected to a ground 113.

On the secondary side of the transformers, first transformer 117 can have first secondary terminal 131 and a second secondary terminal 140, second transformer 125 can have a third secondary terminal 139 and a fourth secondary terminal 138, and third transformer 127 can have a fifth secondary terminal 137 and a sixth secondary terminal 135. The first secondary terminal 131 can be connected to the sixth secondary terminal 135 through a resistor 141, the second secondary terminal 140 can be connected to the third secondary terminal 139, and the fourth secondary terminal 138 can be connected to the fifth secondary terminal 137. In this fashion, the secondary sides of each of the transformers, 117, 125, 127 can be connected in series through resistor 141.

For purpose of illustration and not limitation, as embodied herein, the first, second, and third transformers can be spaced from one another according to IEEE standards. This can assist in reducing likelihood of arcing or magnetic flux between each phase.

For purpose of illustration and not limitation, the apparatus can further include an enclosure. For example and as embodied herein, a NEMA type 3R enclosure can contain the other components of the apparatus, increasing safety and usability. Other enclosures can be used, for example and not limitation, NEMA type 4, NEMA type 4X, Stainless Steel, or other suitable enclosures, which can be selected based on desired properties and operating conditions. Enclosures can reduce external interference with voltage moderation circuit 100. For example and not limitation, enclosures can be selected to reduce the impact of physical interference, for example by surrounding voltage moderation circuit 100. Additionally or alternatively, enclosures can be configured to reduce electromagnetic, and/or electrostatic interference, for example by grounding and shielding the enclosure. Additional benefits of a grounded and shielded enclosure include reduction in interference by Electro-Magnetic Pulses (EMPs) and/or geomagnetic storms.

For purpose of illustration and not limitation, one or more cooling fans can be included in the enclosure. Enclosure cooling fans can prevent internal overheating due environmental factors. Additionally or alternatively, thermal insulation can be provided, for example and not limitation, coupled to the interior and/or the exterior surface of the enclosure. Insulation can moderate the temperature within the enclosure, relative to an external temperature to be warmer or colder as desired.

Voltage moderation circuit 100 operates to moderate voltage surges, and additionally, be operable to moderate ground faults. Voltage moderation circuit 100 can therefore operate as both a surge and fault protector. For example, voltage moderation circuit 100 can moderate voltage surges or ground faults for equipment connected to power bus 102, on any of the three phases. That is, voltage moderation circuit 100 can moderate voltage surges or ground faults at any one of the first single-phase power supply 101, the second single-phase power supply 103, and the third single-phase power supply 105. Thus, voltage moderation circuit 100 can operate as a three-phase pull down resistor for transient voltages, and a three-phase pull up resistor for ground faults.

The disclosed subject matter makes use of a zero-sequence circuit that uses little to no power when the phase voltages are balanced. When the phase voltages are balanced, each single-phase primary can have about 277 volts (e.g., 480 volts/1.732) across it, which reflects about 69 volts across each single-phase secondary. Thus, the transformers are in balance, and no current is bled to ground. As imbalances in phase voltages with respect to ground occur, for example voltage transients or ground faults in one of the phase voltages, the secondary voltages are no longer equal among the three transformers. This can cause secondary currents to circulate through resistor 141, with resistor 141 limiting and dissipating energy from the imbalance.

A transient voltage occurring at any one of the single-phase power supplies, 101, 103, 105, creates an imbalance between the phases on the primary side, which causes a secondary side voltage imbalance of its respective transformer 117, 125, 127. Such imbalance can cause current to flow through the secondary side of the respective transformer, and therefore through resistor 141 and current detector 149. The flow of current through resistor 141 can dissipate excess energy induced by the voltage transient and can create a voltage differential across pilot light 147. The voltage differential across pilot light 147 can cause current to flow through pilot light 147, and thus illumination of pilot light 147 and further dissipation of energy. Feedback from the secondary side of the respective transformer 117, 125, 127 can decrease the voltage at the primary side of the transformer and can serve to moderate the voltage of the respective power supply. Conversely, during a ground fault, feedback from the secondary side of the respective transformer 117, 125, 127 can increase the voltage at the primary side of the transformer and serves to moderate the voltage of the respective power supply.

For example, a voltage transient at the first single-phase power supply 101 causes an imbalance in the first transformer 117, inducing a current between the first input terminal 131 and the first output terminal 140. Current thus flows through resistor 141, pilot light 147, and current detector 149. Pilot light 147 illuminates and current detector 149 can measure the current. Feedback from the secondary side of the first transformer 117 causes the voltage at the first side of the first transformer to drop, and therefore moderates the voltage coming from the first single-phase power supply 101.

Figure 2:
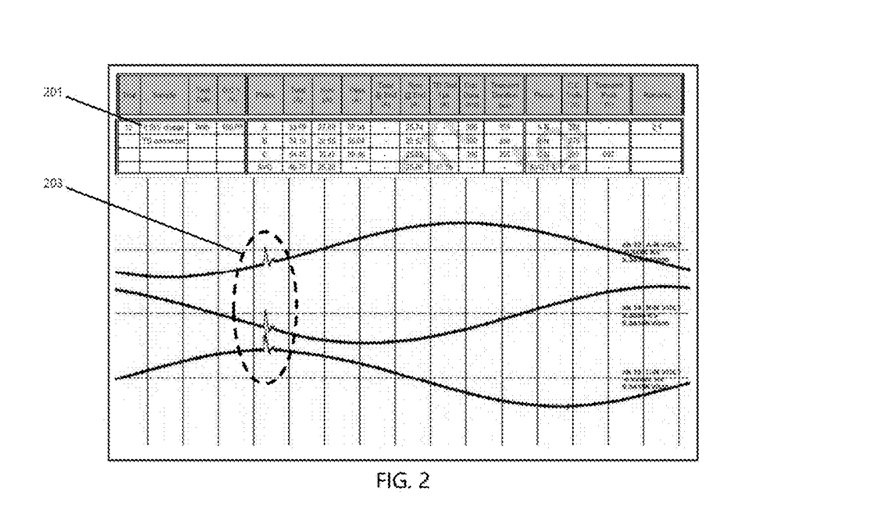
FIG. 2 is a diagram illustrating exemplary voltage transients, in accordance with the disclosed subject matter.

As shown in FIG. 2, for purpose of illustration and not limitation, the effects of the disclosed subject matter can be seen. For example and as embodied herein, for a voltage transient 201 of 6,000 Volts, the disclosed subject matter moderated the resulting voltage spike 203 to around 12 Volts. Power moderating circuit consumed only 0.25 Amperes of current in modulating the 6,000V voltage transient.

Current detector 149 can be configured to produce a warning signal upon the detection of the operation of voltage moderation circuit 100. For example, current detector 149 can produce a warning signal upon detection of a current outside present values. As embodied herein, current detector 149 can be configured to send any type of warning signal, including for example, a message transmitted electronically. For example, current detector 149 can be connected to the internet, and can send a warning signal through the internet to a remote server. Additionally or alternatively, current detector 149 can emit an audible alarm as a warning signal.

Pilot light 147 can be any suitable ground fault indicator capable of indicating the presence of a ground fault or the functioning of circuit 100. For example, ground fault indicators including audible, kinetic, and other types of ground fault indicators can be used. Additionally or alternatively, ground fault indicators can include multiple forms of indication, and can optionally be connected to, for example, the internet.

The indication, by the pilot light 147, the current detector 149, or both, of the operation of voltage moderation circuit 100 can be valuable. For example, the indication of the operation of voltage moderation circuit 100 can improve safety by alerting people nearby to the presence and moderation of a voltage transient or ground fault. Although the disclosed subject matter can moderate a range of voltage transients and ground faults, and as detailed further below can be designed for certain operating conditions, the presence of voltage transients or ground faults can still be dangerous, and therefore alerting those nearby can be valuable. For example, the voltage transient can escalate in scale, including beyond the capabilities of the voltage moderation circuit 100. Additionally or alternatively, the presence of a voltage transient in one single-phase power supply can indicate a higher likelihood of a voltage transient in another single-phase power supply, and the presence of voltage transients in multiple of the single-phase power supplies can cause arc flash events. For purpose of illustration and not limitation, a flash-over can occur when the voltage magnitude exceeds the insulation rating of an electrical component. When this occurs, voltage can discharge through the insulation of the component in unpredictable and potentially damaging ways, and for example, if a person is near an affected electrical component during a flash-over voltage discharge can harm the person, which can be referred to as an arc-flash event.

Voltage moderation circuit 100 can also have additional benefits. For example, if single-phase power supplies 101, 103, and 105 provide out-of-phase power, voltage moderation circuit 100 can correct phase vector alignment. This can serve to provide energy savings to the power system by reducing inefficiency caused by phase vector misalignment. Additionally, voltage spikes, harmonics, and imbalances can cause inefficiency in the form of wasted energy. Voltage spikes, harmonics, and imbalances can also cause electrical components operating on the power supply, for example motors, to operate outside their recommended operating parameters, such as load, voltage, and current. Operating outside recommended operating parameters can decrease the useful life of electrical components. Voltage harmonics can impact the operation of electrical components. For example, zero sequence harmonics, such as the third harmonic, can tend to stop motors operating on the power supply. Negative sequence harmonics, such as the fifth harmonic, can tend to reverse the operation of motors operating on the power supply. Positive sequence harmonics, such as the seventh harmonic, can tend to increase the speed of a motor operating on the power supply. Voltage moderation circuit 100 can reduce the impact of voltage harmonics on a system, which can increase overall efficiency—reduced losses in motor operation can reduce current requirements. For example, energy savings of about 4% can be achieved when voltage harmonics are reduced. A person of ordinary skill in the art will appreciate these and other benefits achieved by reducing the impact of voltage harmonics, including zero, negative, and positive harmonics. For example, a 3 to 5% voltage harmonic can cause a 30 to 50% current harmonic, which in turn can have a significant effect on the overall current and the magnetic forces.

Figure 3A:
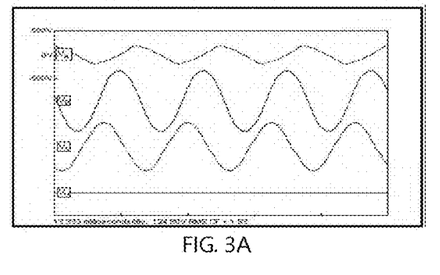
FIG. 3A is a diagram illustrating voltage phase of a conventional power system, for purpose of illustration and comparison with the disclosed subject matter.
Figure 3B:
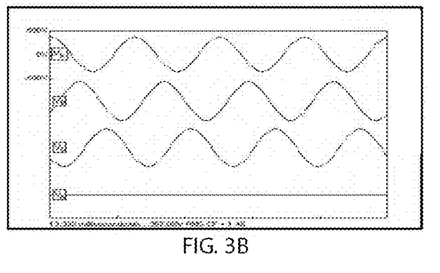
FIG. 3B is a diagram illustrating voltage phase of an exemplary power system using the power monitor and voltage control system of FIG. 1, for purpose of illustration and confirmation of the disclosed subject matter.

For example, and as shown in FIGS. 3A and 3B for purpose of illustration and not limitation, the disclosed subject matter can improve alignment of voltage phase. For example, FIG. 3A is a diagram illustrating the voltage of three single-phase power supplies in a power system not using the disclosed subject matter. FIG. 3A shows a situation in which a phase voltage imbalance of about 61% is present. By contrast, FIG. 3B is a diagram illustrating a similar power system using a voltage moderation circuit 100 in accordance with the disclosed subject matter, in which the phase voltage balance is only 6%.

Figure 4A:
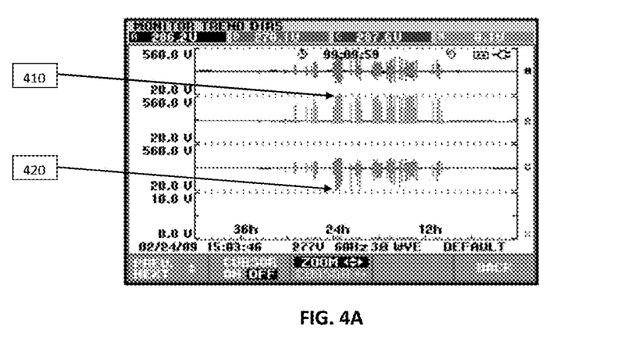
FIG. 4A is a diagram from an exemplary power quality monitor, illustrating arcing ground faults and voltage spikes, for purpose of illustration and comparison with the disclosed subject matter.
Figure 4B:
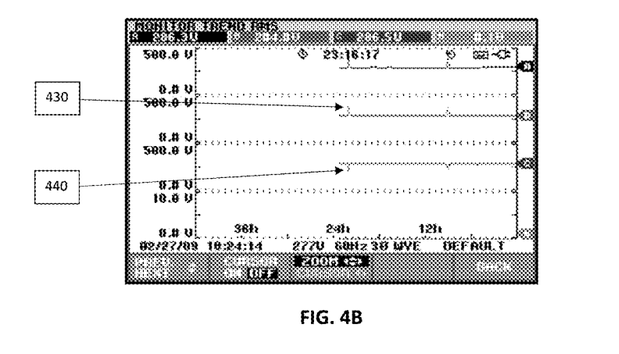
FIG. 4B is a diagram from an exemplary power quality monitor, illustrating arcing ground faults and voltage spikes, for purpose of illustration and confirmation of the disclosed subject matter.

As shown in FIGS. 4A-10B for purpose of illustration and not limitation, the disclosed subject matter can modulate power in various ways. For example, as shown in FIG. 4A, without the use of a voltage moderation circuit 100 in accordance with the disclosed subject matter, voltage spike 410 and arcing ground fault 420 can be relatively large. By contrast, as shown in FIG. 4B, voltage spike 430 and arcing ground fault 440 can be relatively small with the use of a voltage moderation circuit 100 in accordance with the disclosed subject matter.

Figure 5A:
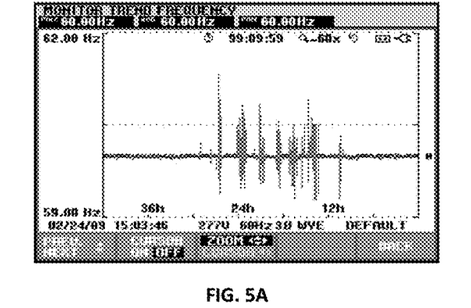
FIG. 5A is a diagram from an exemplary power quality monitor, illustrating frequency stability characteristics, for purpose of illustration and comparison with the disclosed subject matter.
Figure 5B:
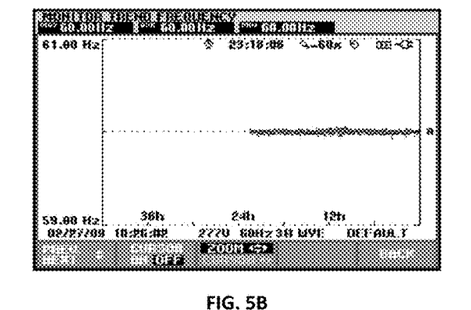
FIG. 5B is a diagram from an exemplary power quality monitor, illustrating frequency stability characteristics, for purpose of illustration and confirmation of the disclosed subject matter.

As shown in FIG. 5A, for purpose of illustration and not limitation, without the use of a voltage moderation circuit 100 in accordance with the disclosed subject matter, frequency instability can be relatively large. By contrast, as shown in FIG. 5B, frequency instability can be relatively small with the use of a voltage moderation circuit 100 in accordance with the disclosed subject matter.

Figure 6A:
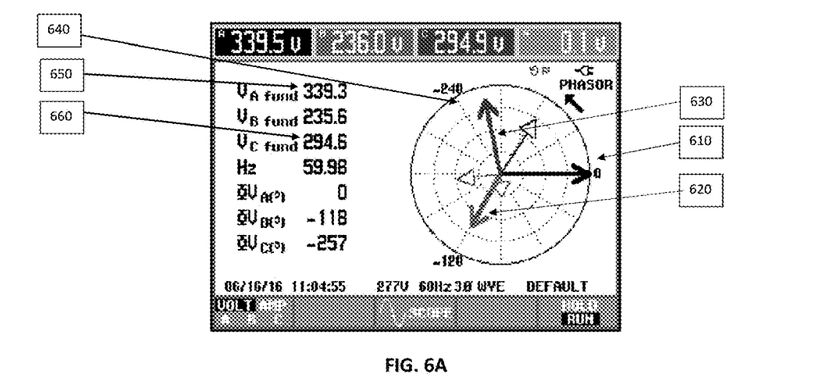
FIG. 6A is a diagram from an exemplary power quality monitor, illustrating voltage phasor characteristics, for purpose of illustration and comparison with the disclosed subject matter.
Figure 6B:
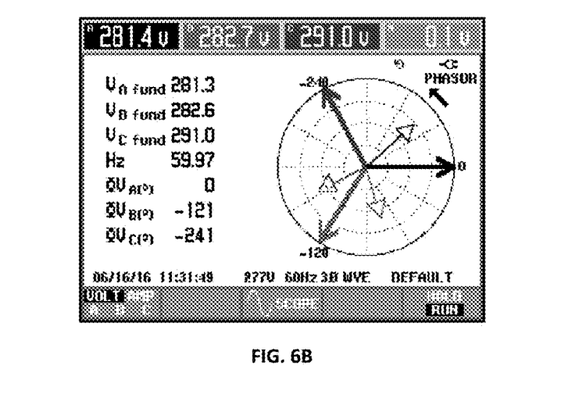
FIG. 6B is a diagram from an exemplary power quality monitor, illustrating voltage phasor characteristics, for purpose of illustration and confirmation of the disclosed subject matter.

As shown in FIG. 6A, for purpose of illustration and not limitation, without the use of a voltage moderation circuit 100 in accordance with the disclosed subject matter, voltage phasor A 610, voltage phasor B 620, and voltage phasor C 630 can be improperly offset. For example, voltage phasor C 630 can be misaligned with the −240 degree mark 640. Similarly, voltage phasor A 610 and voltage phasor C 630 can have magnitudes 650 and 660 larger than the magnitude for voltage phasor B. By contrast, as shown in FIG. 6B, voltage phasors can have improved offset and can have magnitudes in closer alignment with the use of a voltage moderation circuit 100 in accordance with the disclosed subject matter.

Figure 7A:
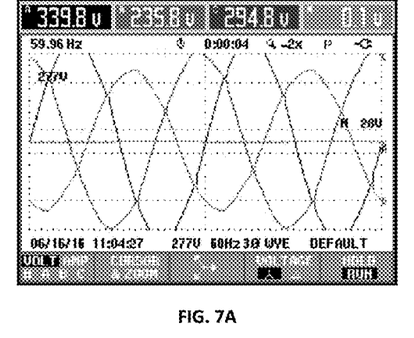
FIG. 7A is a diagram from an exemplary power quality monitor, illustrating voltage differentials, for purpose of illustration and comparison with the disclosed subject matter.
Figure 7B:
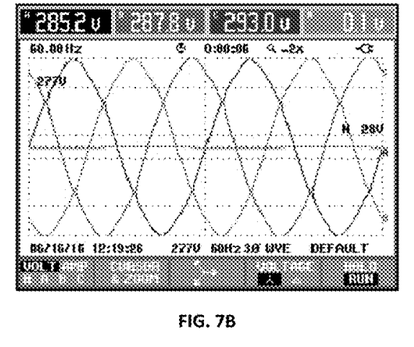
FIG. 7B is a diagram from an exemplary power quality monitor, illustrating voltage balance characteristics, for purpose of illustration and confirmation of the disclosed subject matter.

As shown in FIG. 7A, for purpose of illustration and not limitation, without the use of a voltage moderation circuit 100 in accordance with the disclosed subject matter, voltage differentials can be relatively large. By contrast, as shown in FIG. 7B, voltage differentials can be relatively small with the use of a voltage moderation circuit 100 in accordance with the disclosed subject matter.

Figure 8A:
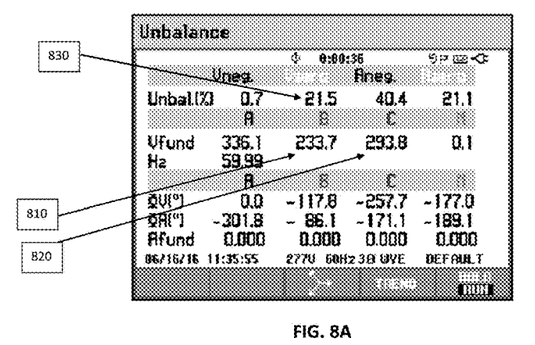
FIG. 8A is a diagram from an exemplary power quality monitor, illustrating voltage balance characteristics, for purpose of illustration and comparison with the disclosed subject matter.
Figure 8B:
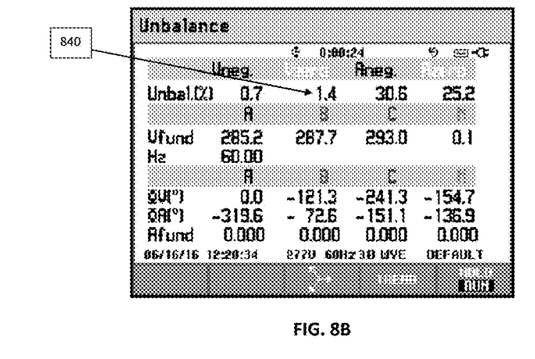
FIG. 8B is a diagram from an exemplary power quality monitor, illustrating voltage balance characteristics, for purpose of illustration and confirmation of the disclosed subject matter.

As shown in FIG. 8A, for purpose of illustration and not limitation, without the use of a voltage moderation circuit 100 in accordance with the disclosed subject matter, voltages 810 and 820 can be imbalanced by, for example, 21.5%, at 830. By contrast, as shown in FIG. 8B, voltages can be imbalanced by, for example, 1.4%, at 840 with the use of a voltage moderation circuit 100 in accordance with the disclosed subject matter.

Figure 9A:
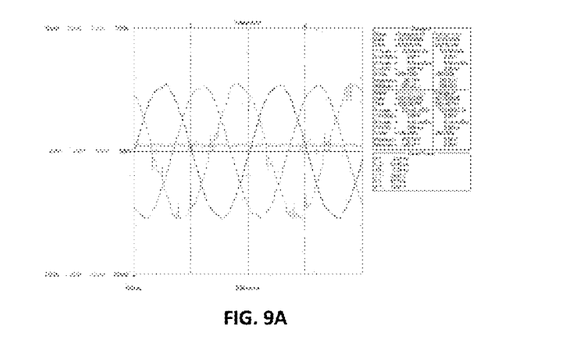
FIG. 9A is a diagram from an exemplary power quality monitor, illustrating exemplary voltage waveforms, for purpose of illustration and comparison with the disclosed subject matter.
Figure 9B:
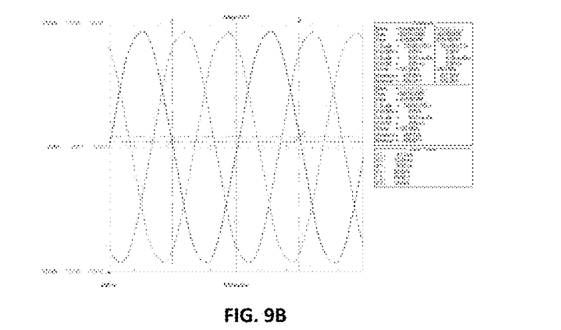
FIG. 9B is a diagram from an exemplary power quality monitor, illustrating exemplary voltage waveforms, for purpose of illustration and confirmation of the disclosed subject matter.

As shown in FIG. 9A, for purpose of illustration and not limitation, without the use of a voltage moderation circuit 100 in accordance with the disclosed subject matter, voltage waveforms can experience distortion. Voltage waveform distortion can be due at least in part to harmonics distortion. By contrast, as shown in FIG. 9B, voltage waveforms can have reduced distortion with the use of a voltage moderation circuit 100 in accordance with the disclosed subject matter.

Figure 10A:
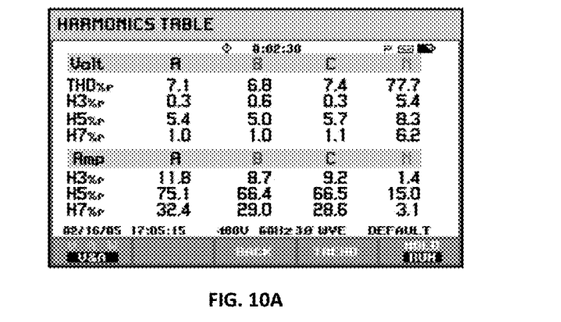
FIG. 10A is a diagram from an exemplary power quality monitor, illustrating voltage and current harmonics, for purpose of illustration and comparison with the disclosed subject matter.
Figure 10B:
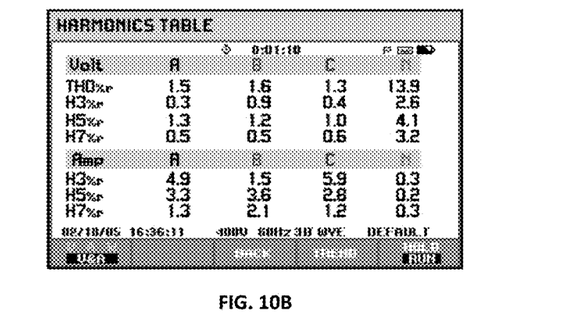
FIG. 10B is a diagram from an exemplary power quality monitor, illustrating voltage and current harmonics, for purpose of illustration and confirmation of the disclosed subject matter.

As shown in FIG. 10A, for purpose of illustration and not limitation, without the use of a voltage moderation circuit 100 in accordance with the disclosed subject matter, voltage and current harmonics can be relatively high. By contrast, as shown in FIG. 10B, voltage and current harmonics can be reduced or inhibited with the use of a voltage moderation circuit 100 in accordance with the disclosed subject matter.

Power quality meter 143 can be connected to the first single-phase power supply 101, the second single-phase power supply 103, and the third single-phase power supply to measure the quality of the power supplied. Power quality meter 143 can be powered by meter power supply 145, and meter power supply 145 can be fed power from fused disconnect 109. As embodied herein, first single-phase power supply 101 and second single-phase power supply 103 feed meter power supply 145 through fused disconnect 109. As embodied herein, meter power supply 145 is selectable for receiving 240 or 480 volts, and outputs 24 volts to power quality meter 143. In this way, meter power supply 145 does not require an additional power source, and power quality meter 143 can monitor the power quality in a more convenient and efficient way than if an additional power source were required.

Power quality meter 143 can monitor the power quality supplied by the single-phase power supplies, 101, 103, and 105 as moderated by voltage moderation circuit 100. For example, and as embodied herein, power quality meter 143 can collect data and/or generate reports, including graphical reports of power quality. Power quality meter 143 can be selectable between generating real time and delayed reports. Power quality reports can include graphical reports. Reports generated by power quality meter 143 can provide information about the impact of voltage transients or ground faults on the overall power system, and can provide information about the efficacy of voltage moderation circuit 100. For example, power quality meter 143 can communicate the severity of the impact. Additionally or alternatively, the power quality meter 143 can be connected to or in communication with a computer network, for example, the internet. The power quality meter 143 include an input for information from the current detector, and can relay information based on this signal to, for example, an "internet of things" facility monitoring system. Relay of information from the power quality meter 143 can occur in any suitable manner, including wired or wireless connections, for example, through an RJ45 (Ethernet or Modbus) connection or a Wi-Fi connection.

For purpose of illustration and not limitation, voltage moderation circuit 100 can further include an event counter. The event counter can maintain a count of the number of voltage transients and/or ground faults moderated by voltage moderation circuit. The event counter can be in any suitable location, including within an enclosure surrounding the voltage moderation circuit 100. Additionally or alternatively, event counter can be coupled to or part of power quality meter 143. Additionally or alternatively, event counter can be coupled to or part of current detector 149 and/or pilot light 147. An example event counter is the Reddington 3400 panel-mount counter. The addition of an event counter to power moderating circuit 100 is beneficial at least in part because it provides a record of durability and operability of the circuit. This record can be beneficial, for example, because it can assist in estimating future needs for power moderation and/or the efficacy of power moderation circuit 100.

The specific dimensions and properties of the components used in the disclosed subject matter can be selected or configured for operation with specific power systems. For example, transformers 117, 125, and 127 can have winding ratios of 4:1, 5:1 (for example but not limitation for 600-volt systems), or 20:1 (for example but not limitation for 2400-volt systems). The winding ratios of the first single-phase power supply, the second single-phase power supply, and the third single-phase power supply can each be the same or can be different. Additionally or alternatively, resistance of the resistor 141 can selected based on the desired functioning environment. For example, resistances of between about 20 to about 100 Ohms can be used. Additionally or alternatively, resistor 141 can be any suitable resistive element capable of providing electrical resistance. For example, a resistive element such as non-inductive resistors can be used. Non-inductive resistance can reduce the potential for current phase shifting within the voltage control circuit, for example, by reducing local inductive interference. Resistors can be chosen to limit current to ranges acceptable for transformer performance and ranges sufficient to provide high power factor energy feedback. High feedback in the power system can be effective to modulate the power. Resistance in an AC circuit can have voltage in phase with the current, which can reduce or inhibit the current and modulate power. The resistor capacities and ratings can be selected such that the resistor is capable of continuously carrying a full load current of the transformers, in addition to providing a current limit to prevent circuit over-heating. In addition or as a further alternative, fuse current ratings of the fused disconnect 109 can be selected based on the voltage and current requirements of the system. For example, fuses used in the fused disconnect can be RK5 rated, 600-volt class, and can have a full load primary current multiplied of 167% of the transformer primary full load current. The fuse type can be selected to be suitable to protect the transformers, for example by multiplying the transformer full load primary current by the suitable ratio recommended, for example and without limitation, in accordance with the National Electrical Code (NEC), section 1.732. Each or any combination of these properties can affect the operational characteristics and effectiveness of the voltage moderation circuit 100 of the disclosed subject matter for a given operating environment.

For purpose of illustration only, and not limitation, as embodied herein, transformers having a winding ratio of 4:1, wiring rated for 600V, fuses rated for 5 Amperes, and a resistor rated for approximately 22 Ohms at nominal operating temperature can be used in voltage moderation circuit 100.

Alternatively, the properties of resistor 141 can be chosen to limit the current to maximum current for the transformer design. For example, a maximum primary imbalance of: 0V, 480V, 480V, on the three phases can be used, in which case secondary voltages of about: 0V, 120V, 120V are expected. The voltage across resistor 141 in such example is about 208V (120V×1.732). To handle this condition, and to handle about 2 Amperes of charge current during maximum imbalance (including using the single-phase transformers of in the exemplary embodiment, if provided), the primary of 480 Volts times 2.3 Amperes equals 1,104 VA. The transformers in this example embodiment are each 1 KVA, with a winding ratio of 4:1, a voltage ratio of 4:1 and a current ratio of 1:4. The secondary current will therefore be a maximum of 9.2 Amperes (2.3 Amp×4). The resistance of resistor 141 is about 22.1 Ohms. The power that resistor 141 must handle is about 1,913 watts: (120V×1.732)×9.2 Amps (times 2 for continuous duty). Resistor 141 can be selected to have a positive temperature coefficient, which can allow the circuit to be self-protecting.

While the disclosed subject matter is described herein in terms of certain preferred embodiments, those skilled in the art will recognize that various modifications and improvements can be made to the disclosed subject matter without departing from the scope thereof. Moreover, although individual features of one embodiment of the disclosed subject matter can be discussed herein or shown in the drawings of the one embodiment and not in other embodiments, it should be apparent that individual features of one embodiment can be combined with one or more features of another embodiment or features from a plurality of embodiments.

In addition to the various embodiments depicted and claimed, the disclosed subject matter is also directed to other embodiments having any other possible combination of the features disclosed and claimed herein. As such, the particular features presented herein can be combined with each other in other manners within the scope of the disclosed subject matter such that the disclosed subject matter includes any suitable combination of the features disclosed herein. Thus, the foregoing description of specific embodiments of the disclosed subject matter has been presented for purposes of illustration and description. It is not intended to be exhaustive or to limit the disclosed subject matter to those embodiments disclosed.

It will be apparent to those skilled in the art that various modifications and variations can be made in the devices of the disclosed subject matter without departing from the spirit or scope of the disclosed subject matter. Thus, it is intended that the disclosed subject matter include modifications and variations that are within the scope of the appended claims and their equivalents.

What is claimed is:

1. An apparatus for power monitoring and voltage control in a three-phase power supply, wherein the three-phase power supply comprises at least a first, second, and third single-phase power supply, each single-phase power supply corresponding to a respective phase of the three-phase power supply bus, the apparatus comprising:
   a voltage moderation circuit comprising:
      a reference node;
      a first transformer having a primary side and a secondary side, wherein the first transformer primary side has a first primary terminal coupled to the first single-phase power supply and a second primary terminal coupled to the reference node, and wherein the first transformer secondary side has a first secondary terminal and a second secondary terminal;
      a second transformer having a primary side and a secondary side, wherein the second transformer primary side has a third primary terminal coupled to the second single-phase power supply and a fourth primary terminal coupled to the reference node, and wherein the second transformer secondary side has a third secondary terminal coupled to the second secondary terminal and a fourth secondary terminal;
      a third transformer having a primary side and a secondary side, wherein the third transformer primary side has a fifth primary terminal coupled to the third single-phase power supply and a sixth primary terminal coupled to the reference node, and wherein the third transformer secondary side has a fifth secondary terminal coupled to the fourth secondary terminal and a sixth secondary terminal; and
      a resistive element coupled between the sixth secondary terminal and the first secondary terminal,
      wherein the voltage moderation circuit formed by the resistive element, the first transformer secondary side, the second transformer secondary side, and the third transformer secondary side is not electrically connected to the reference node, and
      wherein the voltage moderation circuit is configured to reduce an arcing ground fault while allowing a current to flow between the three-phase power supply and the resistive element; and
   a power quality monitor coupled to and configured to measure a power quality of the first, second, and third single-phase power supplies;
      wherein the power quality monitor is configured to provide an indication of the reduced arcing ground fault.

2. The apparatus of claim 1, further comprising a current detector coupled to and configured to measure a current flowing through the first secondary terminal.

3. The apparatus of claim 1, wherein the power quality monitor is coupled to a meter power supply, and the meter power supply is coupled to the three-phase power supply.

4. The apparatus of claim 1, wherein the resistive element has a resistance within a range between 15 and 30 Ohms at normal operating temperature.

5. The apparatus of claim 1, further comprising a cooling device coupled to and configured to dissipate heat from at least one of the resistive element, the ground fault indicator, and the current detector.

6. The apparatus of claim 1, wherein each of the first transformer, the second transformer, and the third transformer has a winding ratio of four to one (4:1).

7. The apparatus of claim 1, wherein the power quality monitor is configured to produce graphical reports of the efficacy of the voltage moderation circuit.

8. The apparatus of claim 1, wherein the current detector is configured to produce a warning signal upon detection of current flow over a predetermined threshold.

9. The apparatus of claim 8, wherein the predetermined threshold is about 5 amperes.

10. The apparatus of claim 8, wherein the warning signal includes a message transmitted electronically to a remote server.

11. The apparatus of claim 1, wherein the voltage moderation circuit is configured to reduce a frequency instability, and
   wherein the power quality monitor is configured to provide an indication of the reduced frequency instability.

12. The apparatus of claim 1, wherein the voltage moderation circuit is configured to reduce a voltage phasor misalignment, and
   wherein the power quality monitor is configured to provide an indication of the reduced voltage phasor misalignment.

13. The apparatus of claim 1, wherein the voltage moderation circuit is configured to reduce a voltage differential, and
   wherein the power quality monitor is configured to provide an indication of the reduced voltage differential.

14. The apparatus of claim 1, wherein the voltage moderation circuit is configured to reduce a voltage waveform distortion, and
   wherein the power quality monitor is configured to provide an indication of the reduced voltage waveform distortion.

15. The apparatus of claim 14, wherein the voltage waveform distortion comprises a harmonics distortion, and
   wherein the power quality monitor is configured to provide an indication of the reduced harmonics distortion.

16. The apparatus of claim 1, wherein the voltage moderation circuit is configured to reduce a voltage imbalance, and
   wherein the power quality monitor is configured to provide an indication of the reduced voltage imbalance.

17. The apparatus of claim 1, wherein the voltage moderation circuit is configured to reduce a voltage spike and,
   wherein the power quality monitor is configured to provide an indication of the reduced voltage spike.

18. An apparatus for power monitoring and voltage control in a three-phase power supply comprising:
   a voltage moderation circuit comprising:
      a first primary terminal on a primary side of first transformer coupled to a first single-phase power supply;
      a second primary terminal on the primary side of the first transformer coupled to a reference node;

a first secondary terminal and a second secondary terminal on the secondary side of the first transformer;
a third primary terminal on a primary side of second transformer coupled to a second single-phase power supply;
a fourth primary terminal on the primary side of the second transformer coupled to the reference node;
a third secondary terminal and a fourth secondary terminal on the secondary side of the second transformer;
a fifth primary terminal on a primary side of third transformer coupled to a third single-phase power supply;
a sixth primary terminal on the primary side of the third transformer coupled to the reference node;
a fifth secondary terminal and a sixth secondary terminal on the secondary side of the third transformer;
a resistive element coupled between the sixth secondary terminal and the first secondary terminal,
wherein the second secondary terminal is coupled to the third secondary terminal, the fourth secondary terminal is coupled to the fifth secondary terminal, and the voltage moderation circuit formed by the resistive element, the first transformer secondary side, the second transformer secondary side, and the third transformer secondary side is not electrically connected to the reference node, and
wherein the voltage moderation circuit is configured to reduce an arcing ground fault while allowing a current to flow between the three-phase power supply and the resistive element; and
a ground fault indicator, coupled between the sixth secondary terminal and the first secondary terminal, in parallel with the resistive element;
a current detector coupled to and configured to measure a current flowing through the first secondary terminal;
a power quality meter coupled to and configured to measure the power quality of the first, second, and third single-phase power supplies, wherein the power quality meter is coupled to a meter power supply, and wherein the meter power supply is coupled to the three-phase power supply;
wherein the power quality monitor is configured to provide an indication of the reduced arcing ground fault.

19. The apparatus of claim 18, wherein the ground fault indicator comprises a pilot light.

20. The apparatus of claim 18, wherein the current detector is configured to produce a warning signal upon the detection of current flow over a predetermined threshold.

21. The apparatus of claim 20, wherein the predetermined threshold is about 5 amperes.

22. The apparatus of claim 18, wherein the voltage moderation circuit is configured to reduce a voltage spike and,
wherein the power quality meter is configured to provide an indication of the reduced voltage spike.

* * * * *